United States Patent [19]

Hirayama

[11] Patent Number: 5,327,624
[45] Date of Patent: Jul. 12, 1994

[54] METHOD FOR FORMING A THIN FILM ON A SEMICONDUCTOR DEVICE USING AN APPARATUS HAVING A LOAD LOCK

[75] Inventor: Makoto Hirayama, Hyogo, Japan

[73] Assignee: Mitsubishi Denki Kabushiki Kaisha, Tokyo, Japan

[21] Appl. No.: 629,566

[22] Filed: Dec. 18, 1990

Related U.S. Application Data

[63] Continuation of Ser. No. 390,287, Aug. 7, 1989, abandoned, and a continuation of Ser. No. 73,172, Jul. 14, 1987, abandoned.

[30] Foreign Application Priority Data

Jul. 16, 1986 [JP] Japan .................................. 61-116874

[51] Int. Cl.⁵ .................. H01L 21/302; H01L 21/463; C23C 16/00
[52] U.S. Cl. .................................... 29/25.01; 437/225; 118/719
[58] Field of Search ................ 118/719; 437/225, 228; 29/25.01

[56] References Cited

U.S. PATENT DOCUMENTS

| | | | |
|---|---|---|---|
| 4,405,435 | 9/1983 | Tateishi et al. | 204/298 |
| 4,498,416 | 2/1985 | Bouchaib | 118/719 |
| 4,505,950 | 3/1985 | Yamazaki | 427/38 |
| 4,592,306 | 6/1986 | Gallego | 118/719 |
| 4,607,593 | 8/1986 | Van Hemel | 118/719 |
| 4,664,062 | 5/1987 | Kamohara et al. | 118/719 |
| 4,681,773 | 7/1987 | Bean | 427/38 |
| 4,733,631 | 3/1988 | Boyarsky et al. | 118/719 |

FOREIGN PATENT DOCUMENTS

| | | |
|---|---|---|
| 0221572 | 11/1985 | Japan . |
| 0170568 | 8/1986 | Japan . |
| 0131455 | 6/1987 | Japan . |
| 0164875 | 7/1987 | Japan . |

Primary Examiner—Brian E. Hearn
Assistant Examiner—David E. Graybill
Attorney, Agent, or Firm—Nixon & Vanderhye

[57] ABSTRACT

A method for forming a thin film on a semiconductor substrate wherein the substrate is transferred between an auxiliary chamber having an inert atmosphere to a reaction chamber having a reactive atmosphere, and wherein the inert and the reactive atmospheres exist concurrently during transfer.

2 Claims, 1 Drawing Sheet

METHOD FOR FORMING A THIN FILM ON A SEMICONDUCTOR DEVICE USING AN APPARATUS HAVING A LOAD LOCK

This is a continuation of application Ser. No. 07/390,287 filed Aug. 7, 1989, which in turn is a continuation of application Ser. No. 07/073,172 filed Jul. 14, 1987 (abandoned).

BACKGROUND OF THE INVENTION

The present invention relates to an apparatus for fabricating semiconductor devices and, particularly, to such apparatus suitable to use in forming thin membranes on main surfaces of semiconductor substrates.

A lateral type reactor such as shown in FIG. 1 has been used heretofore as such apparatus. The lateral type reactor comprises a cylindrical tube 1 into which a plurality of semiconductor substrates 2 arranged vertically on a board 3 are inserted and various thin membranes are formed on the substrates 2 by means of reactions between them and various gases introduced through a gas port 4 thereinto sequentially.

For some reactions which need an electric field, a parallel flat type reactor such as shown in FIG. 2 has been also used. The latter type reactor comprises a reaction tube 1a in which at least a pair of parallel upper and lower electrodes 5a and 5b are arranged and, by means of reaction gases introduced thereinto through a gas port 4a, desired thin membranes are formed on surfaces of semiconductor substrates 2 disposed on the lower electrode 5b acting as a susceptor. In FIGS. 1 and 2, reference numerals 6 and 6a depict evacuation ports, respectively.

In any of these conventional apparata, the reaction tube has to be opened to atmosphere when the substrates are to be inserted into or removed from the tube. Thermal energy required in either apparatus to treat the semiconductor substrates therein is supplied by an external resistance heater, internal infrared lamp or RF induction heater etc. as disclosed in Japanese Patent Publication No. 24467/1986.

In such conventional apparatus, when the thickness of membrane to be formed is small, a control of membrane thickness becomes difficult due to the fact that undesired oxide membrane may be formed additionally during the semiconductor substrates are inserted into or derived from the apparatus. Further, problems of degradation of quality of formed membranes may occur due to oxidation thereof when the semiconductor substrates having the membranes are inserted into or removed from a reactor kept at high temperature.

Japanese Patent Publication No. 21025/1983 discloses a vertical cylinder type reactor in which semiconductor substrates are stacked on a carrier with suitable space therebetween and main surfaces thereof being down, to thereby make thicknesses of epitacially deposited membranes thereon uniform while preventing accumulation of dust thereon.

The latter reactor is, however, disadvantageous in that the semiconductor substrates must be supported with the main surfaces being down, which necessitates a relatively complicated supporting structure. In addition, the problems of thickness control and the degradation of membrane quality are not solved.

SUMMARY OF THE INVENTION

An object of the present invention is to provide an apparatus for fabricating semiconductor device by which the uniformity and controllability of thickness of thin membranes to be formed on semiconductor substrates are greatly improved.

According to the present invention, an auxiliary chamber is provided in a passage through which the semiconductor substrates are inserted into or derived from a main reaction chamber. With the provision of the auxiliary chamber, an atmospheric condition in the passage can be controlled, so that formation of undesired membranes on the substrates can be prevented by changing the atmospheric condition suitably.

DETAILED DESCRIPTION OF THE PREFERRED EMBODIMENT

Figure 3:
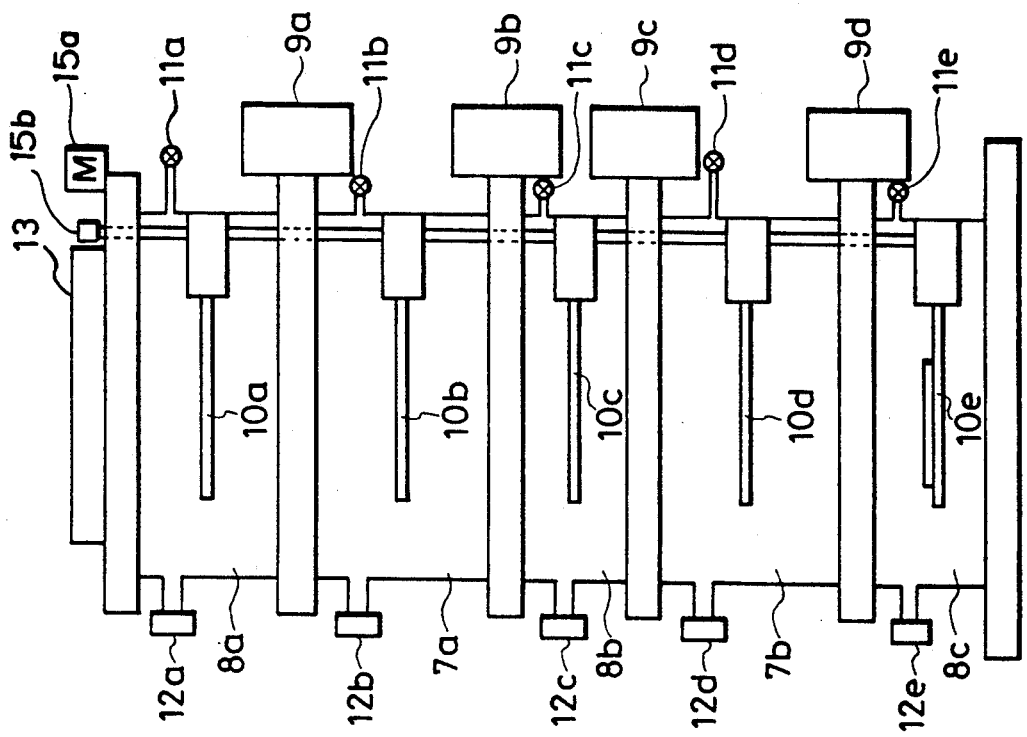
FIG. 3 illustrates an embodiment of an apparatus according to the present invention.
Figure 1:
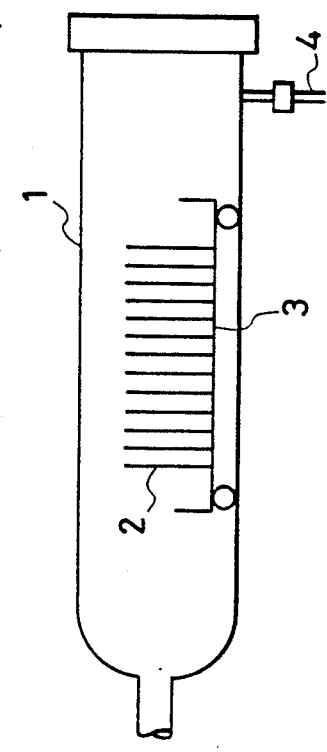
FIG. 1 illustrates, schematically, a conventional lateral type reactor.
Figure 2:
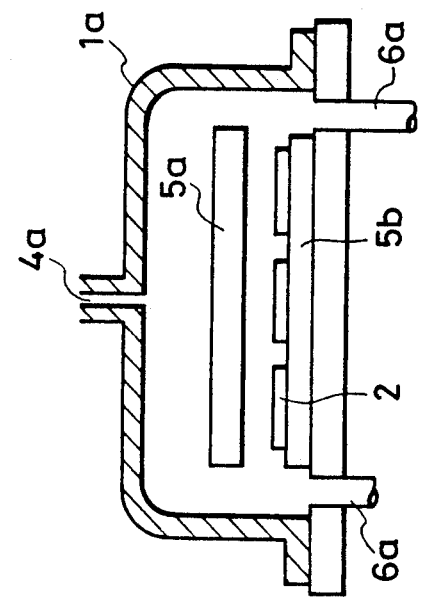
FIG. 2 illustrates another conventional reactor.

FIG. 3 illustrates a construction of an embodiment of the present apparatus for fabricating semiconductor device which comprises a pair of main reaction chambers 7a and 7b arranged vertically. An auxiliary chamber 8a and an auxiliary chamber 8b are respectively arranged on upper and lower ends of the main reaction chamber 7a in communication therewith. The main reaction chamber 7b is communicates at an its upper end thereof with the auxiliary chamber 8b and at a lower end thereof with another auxiliary chamber 8c. The auxiliary chambers 8a to 8c function as load lock chambers each capable of controlling an internal atmospheric condition thereof to change it from an oxidizing or highly reactive state to a stable state by means of gas ports 11a, 11c and 11e and evacuation ports 12a, 12c and 12e.

An inlet 13 through which semiconductor substrates are to be inserted into or derived from the apparatus is opened at a top of the apparatus.

The main reaction chambers 7a and 7b are also provided with gas ports 11b and 11d and evacuation ports 12b and 12d, respectively.

The main reaction chamber 7a is partitioned by gate valves 9a and 9b from the load lock chambers 8a and 8b, respectively, and the main reaction chamber 7b is separated from the load lock chambers 8b and 8c by gate valves 9c and 9d, respectively.

Susceptors 10a to 10e are arranged in the main reaction chambers 7a and 7b and the load lock chambers 8a to 8c, as shown in FIG. 3. Each susceptor is associated with a transporting mechanism (not shown) for transporting the semiconductor substrates mounted thereon from the load lock chamber to the main reaction chamber or vice versa. Such transportation is made possible when the main reaction chamber can be selectively made in communication with the associated load lock chamber by opening an associated one of the gate valves 9a to 9d.

The respective main reaction chambers and the load lock chambers can be evacuated within a short time through the evacuation ports 12a to 12e and can be filled with suitable gases through the gas ports 11a to 11e.

In the known apparatus, the main reaction chambers, in which CVD is performed, are provided independently from each other. In this embodiment, however, each main reaction chamber is associated on both sides thereof with the load lock chambers through which the semiconductor substrates are introduced thereinto or derived therefrom.

Thermal energy necessary to realize desired reaction and heat-treat resultant membranes can be supplied by any of resistance heater, halogen or infrared lamp, RF heater and laser heater, etc.

Describing an operation of the embodiment shown in FIG. 3, semiconductor substrates are inserted through the inlet port 13 to the load lock chamber 8a and mounted on the susceptor 10a. After the load lock chamber 8a and the main chamber 7a are evacuated through the evacuation ports 12a and 12b, respectively, while the gate valve 9a therebetween remains closed, the main chamber 7a is filled with a suitable reaction gas through the gas port 11b. In this case, it may be possible to fill the load lock chamber 8a with a suitable inert gas through the gas port 11a. Then the gate valve 9a is opened to allow the susceptor 10a to move into the reaction chamber 7a by means of the transporting mechanism 15. The transporting mechanism 15 may comprise a conversion mechanism 15a for converting a rotary motion of an electric motor into a vertical motion so that the susceptors can move vertically between the load lock chamber and the main reaction chamber or through the entire apparatus. In the latter case, may be enough to provide a single susceptor. However, in order to increase the workability of the apparatus, it is preferable to provide one susceptor for each chambers as shown in FIG. 3.

After the susceptor 10a reaches the main reaction chamber 7a, the gate valve 9a is closed to separate the main reaction chamber 7a from the load lock chamber 8a. It should be noted that the reaction gas may be introduced into the main reaction chamber 7a after the gate valve 9a is closed.

Then, the semiconductor substrates on the susceptor 10a are heated by a suitable heat source to allow a desired reaction in the main reaction chamber 7a, resulting in desired, identical thin membranes on the substrates. The operations for the reaction chamber 7b are performed similarly to those mentioned above but using another reaction gas to form thin films on the last mentioned thin membranes, which are different from the latter membranes.

Since, according to the present invention, the semiconductor substrates on which thin membranes are to be formed are transported from the load lock chamber, the inner atmospheric condition of which is controllable, to the main reaction chamber, the semiconductor substrates can be treated continuously without exposing them to oxidizing or undesirably reactive gases. Thus, formation of an undesired membrane, i.e., oxide membrane between adjacent ones of desired thin membranes is prevented.

Therefore, the forming process of thin films can be made continuously in the present apparatus in minimal space.

Although, in the described embodiment, the semiconductor substrates are transported through the evacuated load lock chambers, it is possible to fill the load lock chambers with inert gas such as Ar or He.

Further, although the main reaction chambers are arranged vertically, they can be arranged laterally or three-dimensionally. The separated arrangement of the main reaction chambers and the load lock chambers can be substituted by an arrangement of integral units each including one reaction chamber and one load lock chamber. The arrangement of the main reaction chambers and the load lock chambers can be selected suitably to meet with semiconductor manufacturing process to be employed.

The number of the main reaction chambers is not limited to two. In order to form a multi-layered membrane, it is possible to use three or more main reaction chambers one for each layer. That is, for example, a formation of oxide layer by oxidation of the surface of the semiconductor substrate, a formation of epitaxial thin layer thereon, a formation of a thin layer on the epitaxial layer by plasma enhancement epitaxy and a formation of a layer on the latter layer by sputtering can be performed in the respective reaction chambers. Alternatively, it is possible to form a multi-layered membrane by performing different reactions in one main reaction chamber, sequentially.

As mentioned hereinbefore, according to the present invention, the insertion and removal of semiconductor substrates into and from the main reaction chamber is performed through the auxiliary chamber the atmospheric condition in which can be changed suitably. Therefore, it becomes possible to suppress undesired reaction of the substrates in the auxiliary chamber and, thus, to improve the uniformity and controllability of thin membranes to be formed on the substrates in the main reaction chamber.

What is claimed is:

1. A method for manufacturing semiconductor devices, comprising the steps of:
    (a) providing at least one main reaction chamber for receiving at least one semiconductor substrate and an auxiliary chamber in communication with said at least one main reaction chamber;
    (b) isolating said at least one main reaction chamber from said auxiliary chamber by moving an isolation structure between an opened condition, wherein said at least one main chamber and said auxiliary chamber communicate with one another, and a closed condition, wherein said at least one main chamber is isolated from said auxiliary chamber;
    (c) establishing within said at least one main reaction chamber a reactive atmosphere so as to form at least one thin membrane on said substrate;
    (d) establishing an inert atmosphere within said auxiliary chamber when said at least one main reaction chamber and said auxiliary chamber are isolated so that said established inert atmosphere exists within said auxiliary chamber concurrently with said reactive atmosphere established within said reaction chamber according to step (c);
    (e) moving said isolation structure from said closed condition and into said opened condition thereof when said inert and reactive atmospheres exist concurrently in said auxiliary and said at least one main reaction chamber, respectively, and then
    (f) transferring said substrate from said auxiliary chamber and into said at least one main reaction chamber when said isolation structure is in said opened condition so that said substrate transferred thereinto is not exposed to an undesired external atmospheric condition.

2. The method as in claim 1, comprising supporting said semiconductor upon at least one susceptor means.

* * * * *

UNITED STATES PATENT AND TRADEMARK OFFICE
CERTIFICATE OF CORRECTION

PATENT NO. : 5,327,624
DATED : July 12, 1994
INVENTOR(S) : Makoto HIRAYAMA

It is certified that error appears in the above-indentified patent and that said Letters Patent is hereby corrected as shown below:

Title page, column 1, under "Foreign Application Priority Data"
   "61-116874" should read --61-168741--.

Signed and Sealed this

Fifteenth Day of November, 1994

Attest:

BRUCE LEHMAN

Attesting Officer        Commissioner of Patents and Trademarks